(12) United States Patent
Xu et al.

(10) Patent No.: US 8,061,411 B2
(45) Date of Patent: Nov. 22, 2011

(54) HEAT DISSIPATION DEVICE

(75) Inventors: Shou-Biao Xu, Shenzhen (CN);
 Shi-Wen Zhou, Shenzhen (CN);
 Chun-Chi Chen, Taipei Hsien (TW)

(73) Assignees: Fu Zhun Precision Industry (Shen Zhen) Co., Ltd., Shenzhen, Guangdong Province (CN); Foxconn Technology Co., Ltd., Tu-Cheng, New Taipei (TW)

( * ) Notice: Subject to any disclaimer, the term of this patent is extended or adjusted under 35 U.S.C. 154(b) by 506 days.

(21) Appl. No.: 12/396,484

(22) Filed: Mar. 3, 2009

(65) Prior Publication Data
 US 2010/0101757 A1   Apr. 29, 2010

(30) Foreign Application Priority Data
 Oct. 24, 2008   (CN) .......................... 2008 1 0305182

(51) Int. Cl.
 *H05K 7/20* (2006.01)
(52) U.S. Cl. .......... 165/80.3; 165/86; 165/121; 361/697
(58) Field of Classification Search ................ 165/80.3, 165/86, 121, 185; 361/697
 See application file for complete search history.

(56) References Cited

U.S. PATENT DOCUMENTS

| | | | | |
|---|---|---|---|---|
| 4,273,075 A * | 6/1981 | Freihage | .......................... | 122/26 |
| 7,495,913 B1 * | 2/2009 | Liu et al. | ........................ | 361/697 |
| 7,701,718 B2 * | 4/2010 | Yu et al. | ......................... | 361/700 |
| 2002/0167798 A1 * | 11/2002 | Jui-Yuan | ........................ | 361/697 |
| 2004/0042177 A1 * | 3/2004 | Geva et al. | ..................... | 361/705 |
| 2004/0256085 A1 * | 12/2004 | Barsun et al. | ................. | 165/80.3 |
| 2005/0087329 A1 * | 4/2005 | Zhang et al. | ............. | 165/104.33 |
| 2006/0109628 A1 * | 5/2006 | Searby | ........................... | 361/697 |
| 2007/0256813 A1 * | 11/2007 | Ho | ................................. | 165/80.3 |
| 2008/0041561 A1 * | 2/2008 | Zhou et al. | .................... | 165/80.3 |
| 2008/0314555 A1 * | 12/2008 | Wu et al. | ...................... | 165/80.3 |
| 2009/0317240 A1 * | 12/2009 | Wei | ................................ | 415/127 |
| 2010/0314080 A1 * | 12/2010 | Cao et al. | ...................... | 165/121 |

* cited by examiner

*Primary Examiner* — Allen Flanigan
(74) *Attorney, Agent, or Firm* — Altis Law Group, Inc.

(57) ABSTRACT

A heat dissipation device removing heat from an electronic device includes a base plate, a fin set in thermal connection with the base plate, a fixing member and two fans. The fixing member includes a driving part coupled to a top of the fin set, two mounting parts located at two opposite sides of a circumference of the fin set and two connecting arms extending outwardly from the driving part and connecting with the two mounting parts. The two fans, respectively mounted on the two mounting parts of the fixing member and located at two opposite sites of the circumference of the fin set, are driven to rotate around the circumference of the fin set by the driving part and generate two streams of airflow which flow through the fin set that are non-intersecting.

16 Claims, 4 Drawing Sheets

HEAT DISSIPATION DEVICE

BACKGROUND OF THE INVENTION

1. Field of the Invention

The disclosure relates generally to heat dissipation, and more particularly, to a heat dissipation device incorporating fans to produce airflow in different directions.

2. Description of Related Art

It is well known that, during operation, computer electronic devices such as central processing units (CPU) generate large amounts of heat. The heat must be quickly removed from the electronic device to prevent instability or damage. Typically, a heat sink is attached to an outer surface of the electronic device to absorb heat from the electronic device, and the heat absorbed by the heat sink is dissipated to ambient air.

Generally, in order to improve heat dissipation efficiency of a heat sink, a fan and heat pipes are applied to the heat sink. Usually, the fan is fixed in a determined position of a top or a lateral side of the heat sink by a fan holder and cannot be redirected. Thus, the fan of the heat dissipation device can only produce airflow in a single direction in the heat sink. Therefore, when the heat sink has a large dimension, the airflow generated by the fan cannot reach every part of the heat sink, and some parts of the heat sink deprived of the airflow accumulate more heat therein, lowering heat dissipation efficiency of the heat dissipation device for the electronic device.

What is needed, therefore, is a heat dissipation device having fans capable of providing airflow in various directions.

BRIEF DESCRIPTION OF THE DRAWINGS

Many aspects of the present embodiments can be better understood with reference to the following drawings. The components in the drawings are not necessarily drawn to scale, the emphasis instead being placed upon clearly illustrating the principles of the present embodiment. Moreover, in the drawings, like reference numerals designate corresponding parts throughout the several views.

DETAILED DESCRIPTION OF THE INVENTION

Figure 1:
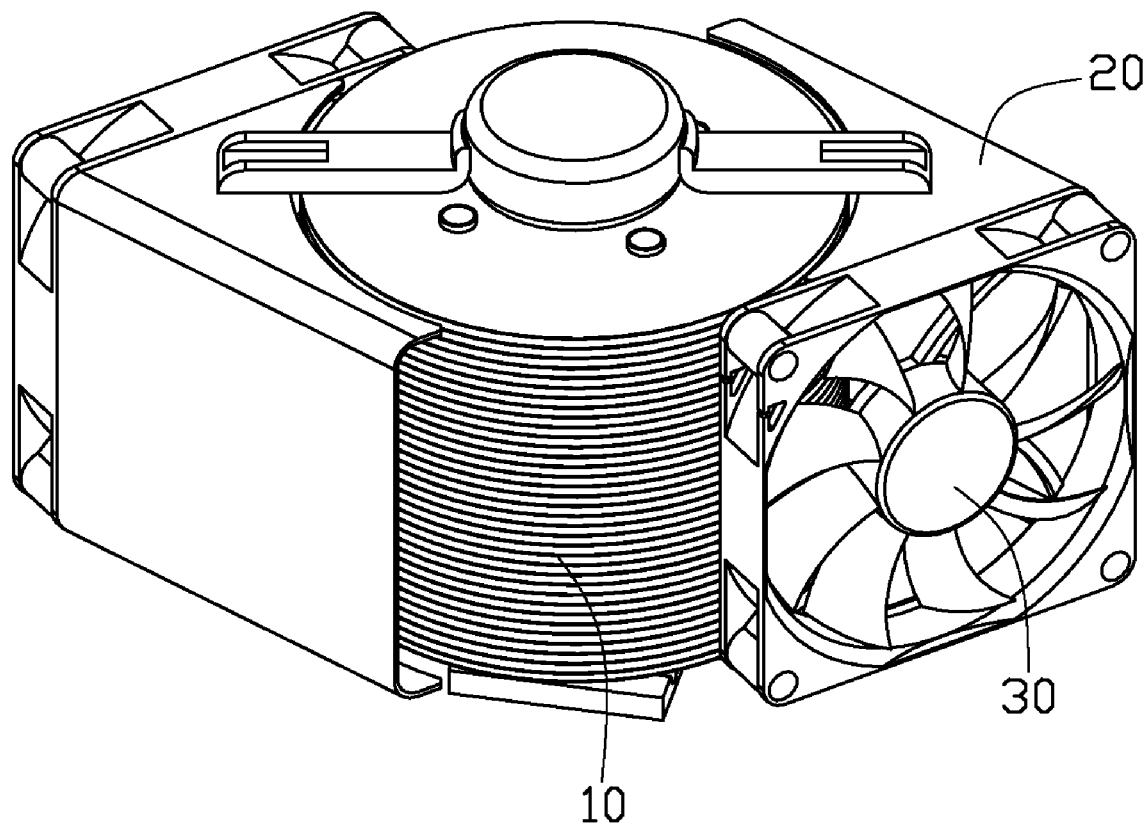
FIG. 1 is an assembled view of a heat dissipation device in accordance with an embodiment of the present disclosure.
Figure 2:
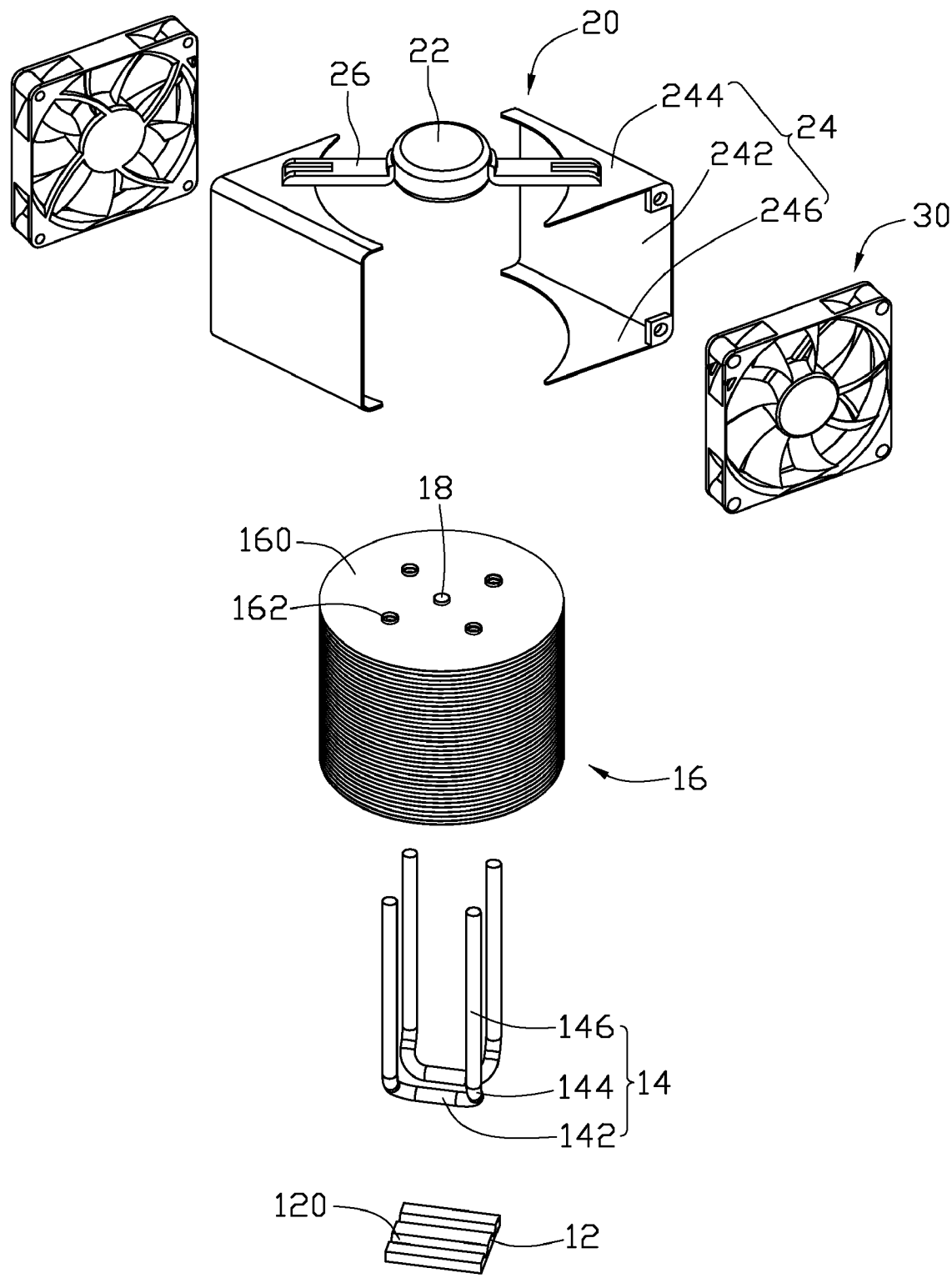
FIG. 2 is an exploded view of the heat dissipation device of FIG. 1.
Figure 3:
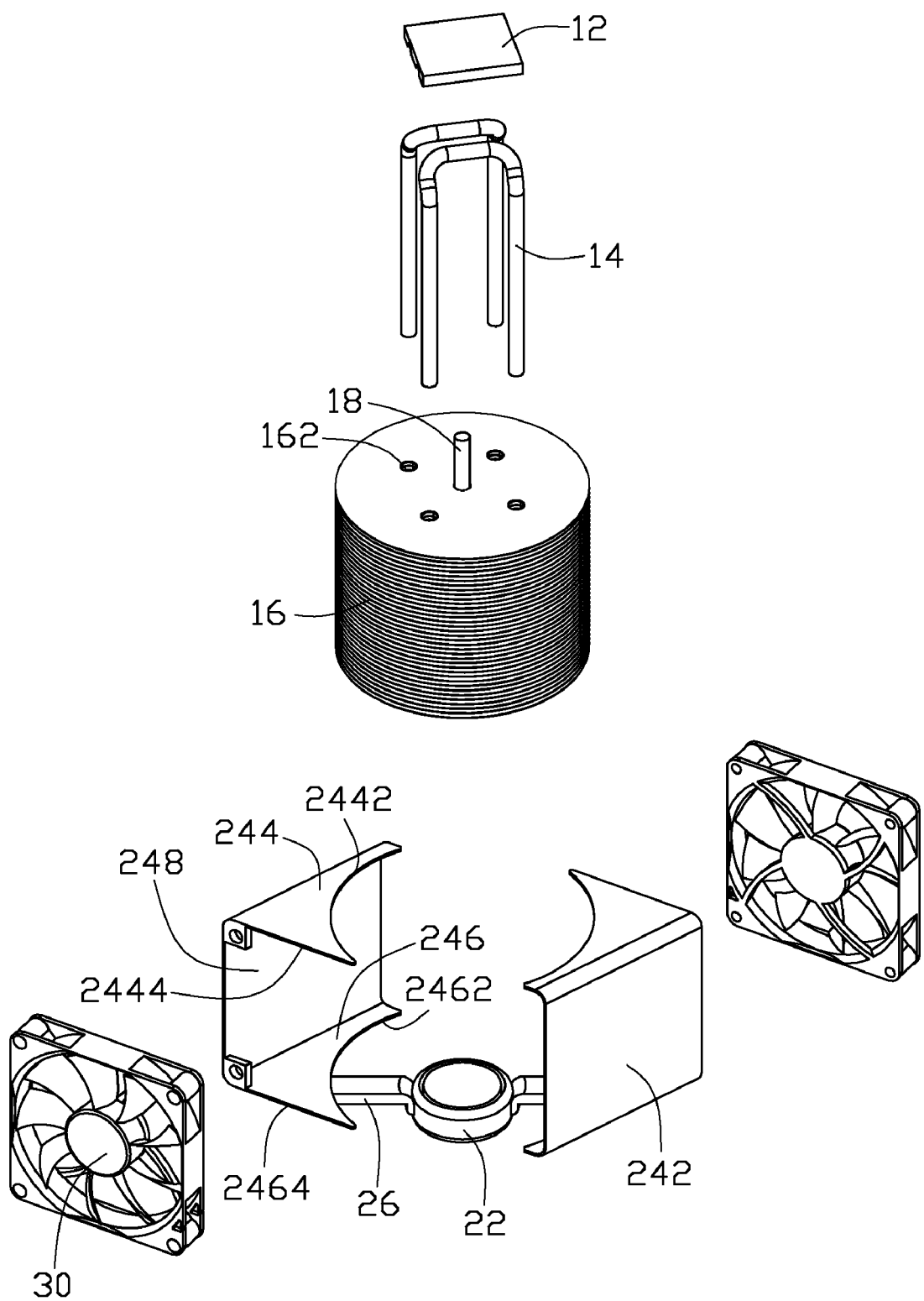
FIG. 3 is an inverted view of the heat dissipation device of FIG. 2.
Figure 4:
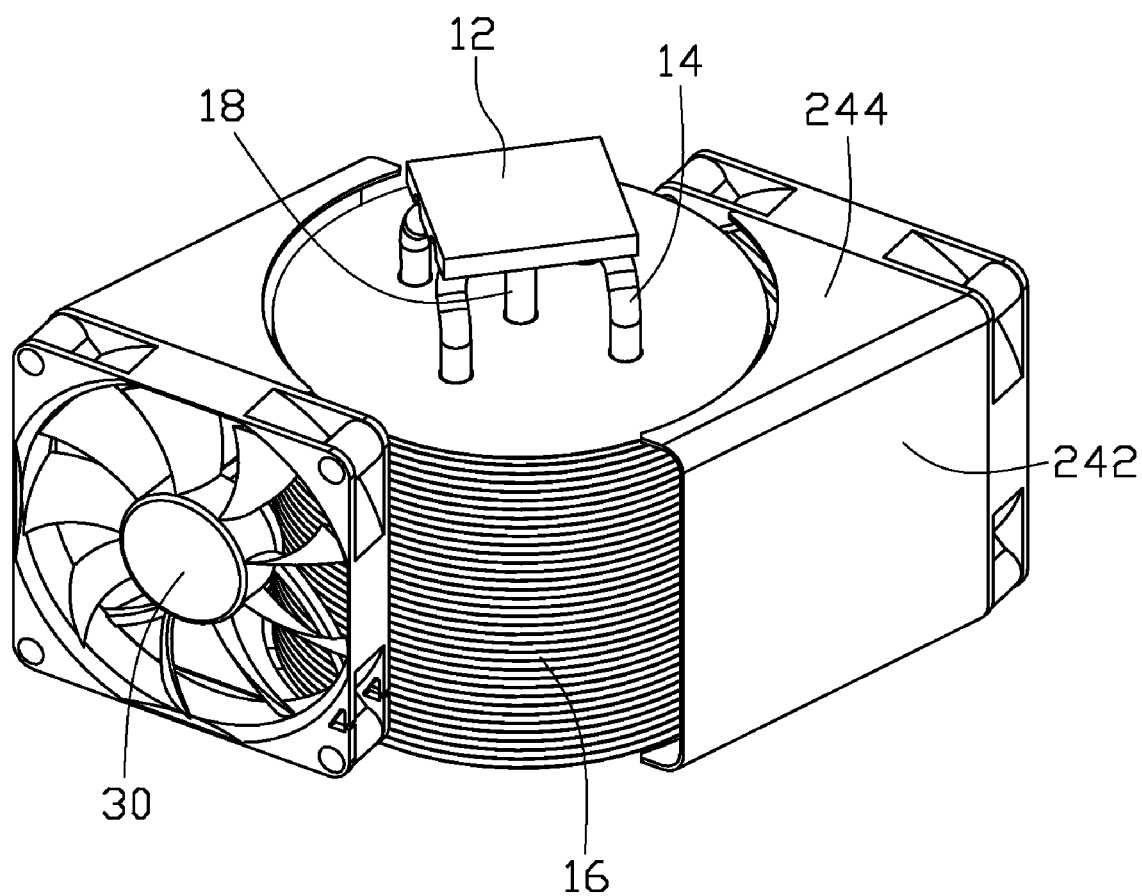
FIG. 4 is an assembled view of the heat dissipation device of FIG. 3.

FIGS. 1 to 4 illustrate a heat dissipation device in accordance with an embodiment of the present disclosure. The heat dissipation device removes heat from an electronic device (not shown) and other electronic components (not shown) in the vicinity of the electronic device. The heat dissipation device comprises a heat sink 10, two fans 30 and a fixing member 20 pivotally connected to a top of the heat sink 10 to rotatably mount the fans 20 at a circumference of the heat sink 10.

The heat sink 10 comprises a base plate 12 in contact with the electronic device, a fin set 16, two heat pipes 14 thermally connecting the base plate 12 and the fin set 16 and a vertical retaining pole 18 extending through a centre of the fin set 16. The base plate 12 is rectangular and defines two elongated receiving grooves 120 therein. The two receiving grooves 120 are separated and perpendicular to two opposite lateral sides thereof. The fin set 16 is columnar and comprises a plurality of circular-sheet fins 160 separated and parallel to the base plate 12. The fin set 16 defines a vertical engaging hole (not labeled) in the centre thereof engagingly receiving the retaining pole 18. The fin set 16 defines a plurality of air passages between the fins 160 for airflow generated by the fans 30. Four vertical receiving holes 162 surround the retaining pole 18 in the centre of the fin set 16 and are symmetrical relative to the retaining pole 18. The retaining pole 18 received in the engaging hole of the fin set 16 is perpendicular to the fins 160 and has a lower end extending downwardly from a bottom of the fin set 16 and an upper end projecting upwardly from a top of the fin set 16. The lower end of the retaining pole 18 contacts the top surface of the base plate 12 and is located between the two receiving grooves 120 of the base plate 12.

Each heat pipe 14 comprises an evaporating section 142 received in the corresponding receiving groove 120 of the base plate 12 and two condensing sections 146 extending upwardly and perpendicularly from two opposite ends of the evaporating section 142. The two condensing sections 146 are received in two neighboring receiving holes 162 of the fin set 16 and parallel to the retaining pole 18. Each heat pipe 14 further has an adiabatic section 144 interconnecting the evaporating section 142 and a corresponding one of the condensing sections 146.

The fixing member 20 comprises a driving part 22 mounted on the top of the fin set 16, two fixing parts 24 at two opposite sides of the circumference of the fin set 16 and two connecting arms 26 extending outwardly from two opposite sides of the driving part 22 and connecting the driving part 22 and the two fixing parts 24. The driving part 22, located at a centre of the top of the fin set 16, is connected to the upper end of the retaining pole 18 and has a motor (not shown) incorporated therein to rotate the connecting arms 26 and the mounting parts 24 around the fin set 16 relative to the retaining pole 18. Each mounting part 24 comprises a top panel 244 connected to a corresponding connecting arm 26, a bottom panel 246 parallel to the top panel 244 and a side panel 242 connected to outer side edges of the top of bottom panels 244, 246 together. The top panel 244 and the bottom panel 246 are two equal three-sided polygons, each having a curved inner side curving inwardly to snugly surround the circumference of the fin set 16, whereby the inner edges of the top and bottom panels 244, 246 embrace the fin set 16 in "( )"-fashion. Outer side edges of the top and bottom panels 244, 246 cooperate with two vertical outer side edges of the two side panels 242 to define two fixing faces on which the two fans 30 are mounted. The two conducting arms 26 are collinear. The two side panels 242 of the mounting parts 24 directly face each other, and are parallel to each other. The two mounting parts 24 are symmetrical relative to the retaining pole 18 received in the centre of the fin set 16. The two fans 30 are mounted on the two fixing faces of the mounting parts 24 and face different parts of the fin set 16. The fans 30 are parallel to each other and respectively produce two airflows through the fin set 16 in two parallel, opposite directions.

In use, heat generated by the electronic device is absorbed by the base plate 12 of the heat sink 10, transferred from the base plate 12 to the fin set 16 via the heat pipes 14 and conducted to the ambient by the airflow produced by the fans 30, whereby the electronic device is cooled efficiently. Furthermore, rotating of the fixing member 20 combined with the fans 30 driven by the driving part 22 of the fixing member 20 can accelerate airflow speeds generated by the fans 30 and distribute the airflow evenly over the fin set 16 to thereby enhance heat dissipating ability of the heat dissipation device.

It is believed that the present embodiments and their advantages will be understood from the foregoing description, and it will be apparent that various changes may be made thereto without departing from the spirit and scope of the invention or sacrificing all of its material advantages, the examples hereinbefore described merely being exemplary or exemplary embodiments of the invention.

What is claimed is:

1. A heat dissipation device for removing heat from an electronic device, comprising:
    a base plate for in contact with the electronic device;
    a fin set in thermal connection with the base plate;
    a fixing member comprising a driving part coupled to a top of the fin set, two mounting parts located at two opposite sides of and capable of rotating around a circumference of the fin set and two connecting arms extending outwardly from two opposite sides of the driving part and connecting the driving part and the two mounting parts together; and
    two fans respectively mounted on the two mounting parts of the fixing member and located at two opposite sites of the circumference of the fin set, wherein the two fans are driven to rotate around the circumference of the fin set by the driving part of the fixing member and generate two airflow streams through the fin set that are non-intersecting.

2. The heat dissipation device of claim 1, wherein the fin set is columnar and comprises a plurality of circular fins separated and parallel to the base plate.

3. The heat dissipation device of claim 2, further comprising a plurality of heat pipes, wherein each heat pipe comprises an evaporating section embedded in a top surface of the base plate and two condensing sections extending upwardly from two opposite ends of the evaporating section and extending vertically through the fins.

4. The heat dissipation device of claim 1, wherein the two fans are parallel to each other and produce the airflows flow through the fin set in two parallel, opposite directions.

5. The heat dissipation device of claim 3, wherein the two conducting arms are collinear with each other.

6. The heat dissipation device of claim 5, wherein each mounting part comprises a top panel connected to a corresponding connecting arm, a bottom panel parallel to the top panel and a side panel connecting outer side edges of the top of bottom panels together.

7. The heat dissipation device of claim 6, wherein the top panel and the bottom panel are two equal three-sided polygons in shape and each have a curved inner side curving inwardly and surrounding the circumference of the fin set.

8. The heat dissipation device of claim 7, wherein outer side edges of the top and bottom panels, cooperate with two vertical outer side edges of the two side panels to define two fixing faces on which the two fans are mounted.

9. The heat dissipation device of claim 8, wherein the two side walls are parallel to each other and face each other.

10. The heat dissipation device of claim 1, further comprising a retaining pole extending through a centre of the fin set, wherein the retaining pole comprises a lower end extending downwardly from a bottom of the fin set and resting at a top surface of the base plate and an upper end projecting upwardly from a top of the fin set and connected to the driving part of the fixing member.

11. A heat dissipation device for removing heat from an electronic device, comprising:
    a base plate for in contact with the electronic device;
    a fin set comprising a plurality of fins separated and parallel to the base plate;
    a plurality of heat pipes thermally connecting the fin set and base plate;
    two fans; and
    a fixing member comprising a driving part mounted on a top of the fin set, two mounting parts securing the two fans to two opposite sides of a circumference of the fin set and two connecting arms extending outwardly from two opposite sides of the driving part and connecting the driving part and the two mounting parts;
    wherein the two fans are driven to rotate around the circumference of the fin set by the driving part of the fixing member and generate two streams of airflow through the fin set in two parallel, opposite directions.

12. The heat dissipation device of claim 11, wherein the two conducting arms are collinear.

13. The heat dissipation device of claim 12, wherein each mounting part comprises a top panel connected to a corresponding connecting arm, a bottom panel parallel to the top panel, and a side panel connected to outer side edges of the top of bottom panels together.

14. The heat dissipation device of claim 13, wherein the top panel and the bottom panel are two equal three-sided polygons, each having a curved inner side curving inwardly and surrounding the circumference of the fin set.

15. The heat dissipation device of claim 14, wherein outer side edges of the top and bottom panels cooperate with two vertical outer side edges of the two side panels to define two fixing faces on which the two fans are mounted.

16. The heat dissipation device of claim 15, wherein the two side walls are parallel and face each other.

* * * * *